(12) United States Patent
Jang et al.

(10) Patent No.: US 7,863,075 B2
(45) Date of Patent: Jan. 4, 2011

(54) METHOD FOR MANUFACTURING SOLAR CELL

(75) Inventors: Taek Yong Jang, Suwon-si (KR); Byung Il Lee, Seongnam-si (KR)

(73) Assignee: TG Solar Corporation, Hwaseong-Si, Gyeonggi-Do (KR)

( * ) Notice: Subject to any disclaimer, the term of this patent is extended or adjusted under 35 U.S.C. 154(b) by 0 days.

(21) Appl. No.: 12/740,314

(22) PCT Filed: Oct. 29, 2008

(86) PCT No.: PCT/KR2008/006379

§ 371 (c)(1),
(2), (4) Date: Apr. 28, 2010

(87) PCT Pub. No.: WO2009/057945

PCT Pub. Date: May 7, 2009

(65) Prior Publication Data

US 2010/0240165 A1    Sep. 23, 2010

(30) Foreign Application Priority Data

Oct. 29, 2007  (KR) .................. 10-2007-0109164
Oct. 29, 2007  (KR) .................. 10-2007-0109165

(51) Int. Cl.
*H01L 31/20* (2006.01)

(52) U.S. Cl. .................. 438/58; 438/97; 438/476; 438/486; 438/496; 257/E31.048

(58) Field of Classification Search .................. 438/58
See application file for complete search history.

(56) References Cited

U.S. PATENT DOCUMENTS 5,147,826 A     9/1992   Liu et al.
5,797,999 A *   8/1998   Sannomiya et al. ......... 136/258

FOREIGN PATENT DOCUMENTS

| JP | 9181344 A | 7/1997 |
| KR | 2002-0027775 A | 4/2002 |
| KR | 2003-0017202 | 3/2003 |
| KR | 10-0392924 B1 | 1/2004 |

* cited by examiner

*Primary Examiner*—Stephen W Smoot
(74) *Attorney, Agent, or Firm*—Mannava & Kang, P.C.

(57) ABSTRACT

A manufacturing method of a polycrystalline solar cell is disclosed. A polycrystalline silicon solar cell in accordance with the present invention performs crystallization-annealing amorphous silicon with a metal catalyst so as to reduce a crystallization temperature. The manufacturing method of a solar cell in accordance with the present invention includes the steps of (a) forming a first amorphous silicon layer on a substrate; (b) forming a second amorphous silicon layer on the first amorphous silicon layer; (c) forming a metal layer on the second amorphous silicon layer; (d) performing crystallization-annealing the second amorphous silicon layer; and (e) forming a third amorphous silicon layer on a resulting crystalline silicon layer of the step (d).

17 Claims, 18 Drawing Sheets

20

METHOD FOR MANUFACTURING SOLAR CELL

PRIORITY

The present application claims priority under 35 U.S.C. §371 to PCT Application PCT/KR2008/006379, filed on Oct. 29, 2008, which claims priority to Korean Patent Application No. 10-2007-0109164, filed on Oct. 29, 2007, and Korean Patent Application No. 10-2007-0109165, filed on Oct. 29, 2007, the disclosures of which are hereby incorporated by reference in their entireties.

TECHNICAL FIELD

The present invention relates to a method for manufacturing silicon solar cells, and more specifically, to a method for manufacturing polycrystalline silicon solar cells and tandem polycrystalline silicon solar cells with high photovoltaic efficiency.

BACKGROUND ART

Solar cells are key elements in photovoltaic technologies that convert solar light directly into electricity, and are widely used in a variety of applications from the universe to homes.

A solar cell is basically a diode having a p-n junction and its operation principle is as follows. When solar light having an energy greater than the band gap energy of a semiconductor is incident on the p-n junction of a solar cell, electron-hole pairs are generated. By an electric field created at the p-n junction, the electrons are transferred to the n layer, while the holes are transferred to the p layer, thereby generating photovoltaic force between the p and n layers. When both ends of the solar cell are connected to a load or a system, electric power is produced as current flows.

Solar cells are classified into a variety of types depending on the materials used to form an intrinsic layer (that is, light absorption layer). In general, silicon solar cells having intrinsic layers made of silicon are the most popular ones. There are two types of silicon solar cells: substrate-type (monocrystalline or polycrystalline) solar cells and thin film type (amorphous or polycrystalline) solar cells. Besides these two types of solar cells, there are CdTe or CIS (CuInSe$_2$) compound thin film solar cells, solar cells based on III-V family materials, dye-sensitized solar cells, organic solar cells, and so on.

Monocrystalline silicon substrate-type solar cells have remarkably high conversion efficiency compared to other types of solar cells, but have a fatal weakness in that their manufacturing costs are very high due to the use of monocrystalline silicon wafers. Also, polycrystalline silicon substrate-type solar cells can be produced at relatively low manufacturing costs compared to monocrystalline silicon substrate-type solar cells, but they are not much different from monocrystalline silicon substrate-type solar cells because solar cells of both types are made out of bulk raw materials. Thus, their raw material price is expensive and their manufacturing process is complicate, thus making it difficult to cut down the manufacturing costs.

As one solution to resolve the deficiencies of those substrate-type solar cells, thin film type silicon solar cells have drawn a lot of attentions mainly because their manufacturing costs are remarkably low by depositing a silicon thin film as an intrinsic layer over a substrate such as glass. In effect, the thin film silicon solar cell can be produced about 100 times thinner than the substrate-type silicon solar cell.

Amorphous silicon thin film solar cells were firstly developed out of the thin film silicon solar cells and are started to be used in homes. Since amorphous silicon can be formed by chemical vapor deposition (CVD), it greatly contributes for mass-production of amorphous silicon solar cells and low manufacturing costs. On the contrary, amorphous silicon solar cells have very low photovoltaic efficiency compared with substrate silicon solar cells because of a lot of silicon atoms with dangling bonds present in amorphous silicon. In addition, amorphous silicon solar cells have a relatively short lifespan and their efficiency is more apt to degrade with increased use thereof.

Therefore, as an effort to complement the foregoing shortcomings of amorphous silicon (thin film) solar cells, polycrystalline silicon thin film solar cells and tandem thin film solar cells having at least two photovoltaic units have been developed.

DISCLOSURE

Technical Problem

With the use of polycrystalline silicon for an intrinsic layer, polycrystalline silicon thin film solar cells exhibit more superior performance than amorphous silicon thin film solar cells using amorphous silicon for an intrinsic layer.

However, a problem with such polycrystalline silicon thin film solar cells is that it is not easy to prepare polycrystalline silicon. To be more specific, polycrystalline silicon is usually obtained through a solid phase crystallization of amorphous silicon. The solid phase crystallization of amorphous silicon involves a high-temperature (e.g., 600° C. or higher) annealing over a period of several tens of hours, which is not suitable for mass-production of solar cells. Especially, an expensive quartz substrate has to be used, instead of a conventional glass substrate, to sustain such a high temperature of 600° C. or higher during the solid phase crystallization, but this can increase the manufacturing costs of solar cells. Moreover, the solid phase crystallization is known to degrade the properties of solar cells because polycrystalline silicon grains tend to grow in an irregular orientation and are very irregular in size.

Tandem thin film solar cells include a photovoltaic layer having a wide band gap and a photovoltaic layer having a narrow band gap so as to enhance the photovoltaic efficiency, and prevent degradation of photovoltaic efficiency caused by the photo-aging phenomenon to some extent. For example, Saitoh, et al. manufactured tandem amorphous Si (a-Si)/micro-crystalline Si (μc-Si) thin film solar cells by plasma enhanced chemical vapor deposition (PECVD). Here, the initial photovoltaic efficiency in 1 cm$^2$ was 9.4%, and the resultant photovoltaic efficiency in the obtained solar cells was 8.5%.

However, to manufacture tandem silicon thin film solar cells developed by Saitoh, et al., micro-crystalline Si (μc-Si) should be formed under the conditions of low deposition pressure and high deposition power, so that the deposition time increases too much, making it difficult to be adapted to the mass-production of solar cells.

Therefore, the conventional polycrystalline silicon thin film solar cells and tandem silicon thin film solar cells have some limitations for achieving high photovoltaic efficiency as well as good mass productivity.

Technical Solution

The present invention has been devised to resolve the above-mentioned shortcomings, and it is, therefore, an object of the present invention to provide a method for manufacturing polycrystalline silicon thin film solar cells with high photovoltaic efficiency.

Another object of the present invention is to provide a method for manufacturing polycrystalline silicon thin film solar cells at considerably reduced manufacturing time and much reduced costs to thereby improve mass-productivity.

Still another object of the present invention is to provide a method for manufacturing solar cells with enhanced photovoltaic efficiency by making such polycrystalline silicon thin film solar cells in the tandem structure.

ADVANTAGEOUS EFFECTS

The manufacturing method of solar sell in accordance with the present invention can enhance photovoltaic efficiency of solar cell by forming a polycrystalline silicon layer through metal induced crystallization.

In addition, as the polycrystalline silicon layer is formed over a conventional glass substrate, solar cell in accordance with the present invention can be produced at lower manufacturing costs.

Also, the manufacturing method of solar cell in accordance with the present invention can minimize leak current by removing a residual metal from the polycrystalline silicon layer.

Moreover, the manufacturing method of solar cell in accordance with the present invention can enhance photovoltaic efficiency of solar cell by making a tandem solar cell.

DESCRIPTION OF DRAWINGS

The above and other objects and features of the present invention will become apparent from the following description of the preferred embodiments given in conjunction with the accompanying drawings, in which.

BEST MODE FOR THE INVENTION

Figure 1:
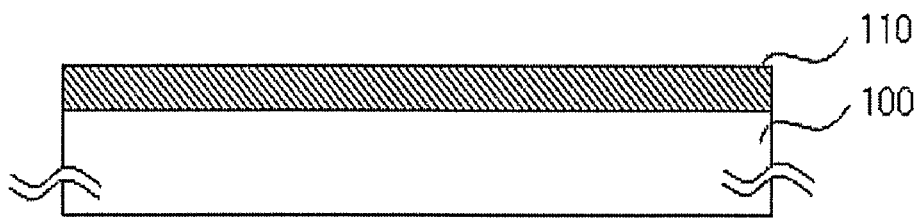
FIGS. 1 to 9 are cross-sectional views illustrating a manufacturing method of a solar cell in accordance with a first embodiment of the present invention.

In accordance with one aspect of the present invention, there is provided a method for manufacturing a solar cell, including the steps of: (a) forming a first amorphous silicon layer on a substrate; (b) forming a second amorphous silicon layer on the first amorphous silicon layer; (c) forming a metal layer on the second amorphous silicon layer; (d) performing crystallization-annealing the second amorphous silicon layer; and (e) forming a third amorphous silicon layer on a resulting crystalline silicon layer of the step (d).

In accordance with another aspect of the present invention, there is provided a method for manufacturing a solar cell, including the steps of: (a) forming a first amorphous silicon layer on a substrate; (b) forming a second amorphous silicon layer on the first amorphous silicon layer; (c) forming a third amorphous silicon layer on the second amorphous silicon layer; (d) forming a fourth amorphous silicon layer on the third amorphous silicon layer; (e) forming a fifth amorphous silicon layer on the fourth amorphous silicon layer; (f) forming a metal layer on the fifth amorphous silicon layer; (g) performing crystallization-annealing the fifth amorphous silicon layer; and (h) forming a sixth amorphous silicon layer on a resulting crystalline silicon layer of the step (g).

The method can further include the step of performing gettering a residual metal in the resulting crystalline silicon layer of the step (d).

The method can further include the step of performing gettering a residual metal in the resulting crystalline silicon layer of the step (g).

The first to third amorphous silicon layers can be formed by chemical vapor deposition.

The first to sixth amorphous silicon layers can be formed by chemical vapor deposition.

The metal layer can contain Ni, Al, Ti, Ag, Au, Co, Sb, Pd, Cu, or a combination thereof.

The metal layer can be formed by physical vapor deposition or chemical vapor deposition.

A crystallization-annealing temperature can be in a range of 400 to 700° C.

A crystallization-annealing temperature can be lower than a solid phase crystallization temperature Of an amorphous silicon.

A gettering temperature can be in a range of 400 to 600° C.

The metal can react with impurities in the third amorphous silicon layer to produce a compound.

The metal can react with impurities in the sixth amorphous silicon layer to produce a compound.

MODE FOR THE INVENTION

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different from one another, are not necessarily mutually exclusive. For example, a particular feature, structure, or characteristic described herein in connection with one embodiment may be implemented within other embodiments without departing from the spirit and scope of the present invention. Also, it is to be understood that the positions or arrangements of individual elements in the embodiment may be changed without separating the spirit and scope of the present invention. The following detailed description is, therefore, not to be taken in a limiting sense, and the scope of the present invention is defined only by the appended claims that should be appropriately interpreted along with the full range of equivalents to which the claims are entitled. In the drawings, like reference numerals identify like or similar elements or functions through the several views.

Embodiment I

Hereinafter, a first embodiment of the present invention will be explained in detail with reference to the accompanying drawings.

FIGS. 1 to 9 are cross-sectional views illustrating a manufacturing method of a solar cell in accordance with a first embodiment of the present invention.

Figure 9:
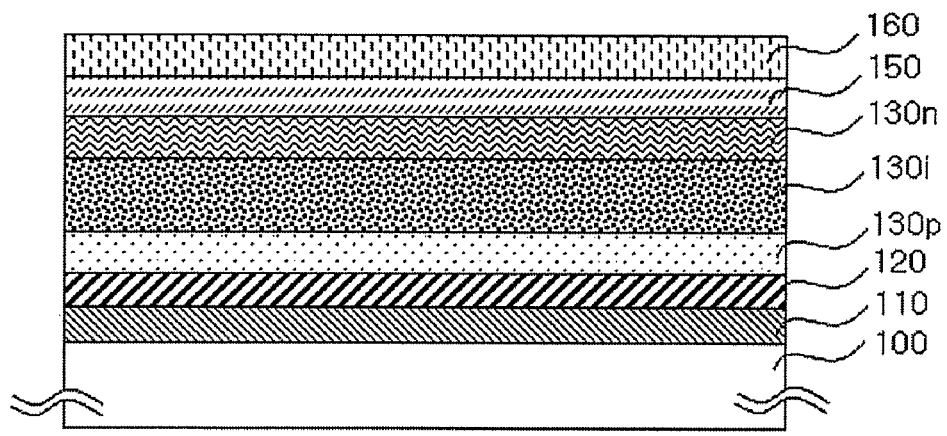

FIG. 9 illustrates a complete polycrystalline silicon (thin film) solar cell 10 in accordance with the first embodiment of the present invention.

Referring to FIG. 9, the polycrystalline silicon solar cell 10 includes an antireflective layer 110, a first transparent conductive layer 120, a p-type silicon layer 130$p$, an i-type silicon layer 130$i$, an n-type silicon layer 130$n$, a second transparent conductive layer 150, and a metal electrode layer 160, which are staked sequentially over a substrate 10. Among the silicon layers, at least the i-type silicon layer 130i is a polycrystalline silicon layer.

To be more specific, the polycrystalline silicon solar cell 10 has a p-i-n structure. Here, the p-i-n structure indicates a structure of the p-type doped silicon layer 130p, the n-type doped silicon layer 130n, and the i-type (that is, intrinsic) silicon layer 130i sandwiched between them, with the i-type silicon layer being relatively insulating compared to the p-type silicon layer 130p and the n-type silicon layer 130n.

While this embodiment illustrates that a completely undoped i-type silicon layer 130i is placed between the p-type silicon layer 130p and the n-type silicon layer 130n, the present invention is not necessarily limited thereto, and an amorphous silicon layer being relatively insulating (i.e., having low conductivity) compared to the p-type silicon layer 130p and the n-type silicon layer 130n may also be placed. For example, it may also be possible to produce highly doped p-type and n-type silicon layers 130p and 130n, and interpose a silicon layer 130i doped with n-type or p-type impurities at a low density between them.

The following is a detailed description about each step of a manufacturing method of the solar cell 10 in accordance with the first embodiment of the present invention.

First, with reference to FIG. 1, the antireflective layer 110 is formed on the substrate 100. For the solar cell 10, the substrate 100 is preferably made out of a transparent material such as glass and plastic to absorb solar light.

Here, the substrate 100 may undergo a texturing process to improve the efficiency of a solar cell. The texturing process is done to prevent impairment of the photovoltaic efficiency of a solar cell by the optical loss in result of the reflection of incident light at the surface of the substrate. Therefore, the texturing process mainly involves making the surface of a target substrate used for a solar cell rough, i.e., forming an irregular pattern on the surface of a substrate. Once the surface of the substrate becomes rough by texturing, the light that reflected once reflects again and lowers the reflectances of incident light at the surface of the substrate such that a greater amount of light is captured to reduce the optical loss.

The antireflective layer 110 serves to prevent the efficiency degradation of the solar cell 10 that is caused when solar light incoming through the substrate 100 is not absorbed but is reflected outside right away. To this end, the antireflective layer 110 may contain a silicon oxide ($SiO_x$) or a silicon nitride ($SiN_x$), for example. Examples of the method for forming the antireflective layer 110 may include, but are not limited to, low pressure chemical vapor deposition (LPCVD), plasma enhanced chemical vapor deposition (PECVD), and so on.

Figure 2:
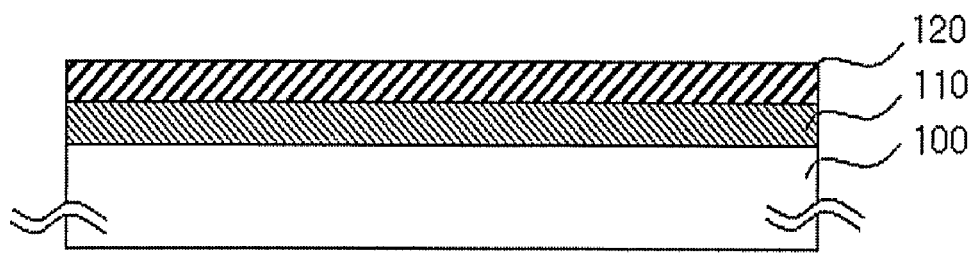

Next, referring to FIG. 2, a first transparent conductive layer 120 is formed on the antireflective layer 110. The first transparent conductive layer 120 serves to transmit solar light and enable electric connection with a p-type silicon layer 130p. For example, the first transparent conductive layer 120 may contain ITO (Indium Tin Oxide) or ZnO doped with impurities such as metal. Examples of the method for forming the first transparent conductive layer 120 may include, but are not limited to, physical vapor deposition (PVD) such as sputtering, and so on.

Figure 3:
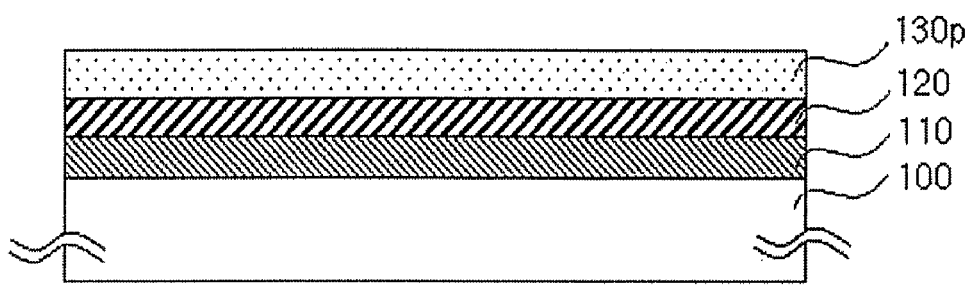
Figure 4:
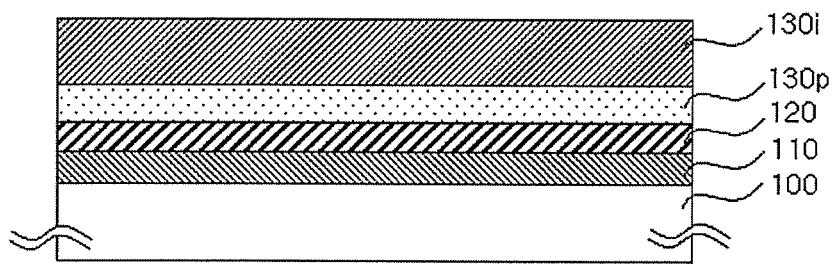

Referring to FIGS. 3 and 4, two-layer structured amorphous silicon layers, that is, the p-type amorphous silicon layer 130p and an i-type amorphous silicon layer 130i, are formed sequentially on the first transparent conductive layer 120.

Examples of the method for forming the p-type amorphous silicon layer 130p and the i-type amorphous silicon layer 130i may include, but are not limited to, chemical vapor deposition such as LPCVD, PECVD, hot wire chemical vapor deposition (HWCVD), and so on. Preferably, the p-type amorphous silicon layer 130p is doped in situ during the formation of the amorphous silicon layer. Typically, boron (B) is used as an impurity for the p-type doping. The thickness and the doping concentration for each of the p-type amorphous silicon layer 130p and the i-type amorphous silicon layer 130i are determined in conformity with the thickness and the doping concentration typically selected for silicon solar cells.

To manufacture polycrystalline silicon solar cells, the present invention employs the so-called metal induced crystallization (MIC) which crystallizes amorphous silicon with a metal catalyst, thereby crystallizing the i-type amorphous silicon layer 130i to a polycrystalline silicon layer. The MIC is well known in the field of polycrystalline silicon thin film transistor (Poly Si TFT) corresponding to a driving circuit in a flat panel display (e.g., LCD), and therefore, details thereon will be omitted here.

Figure 5:
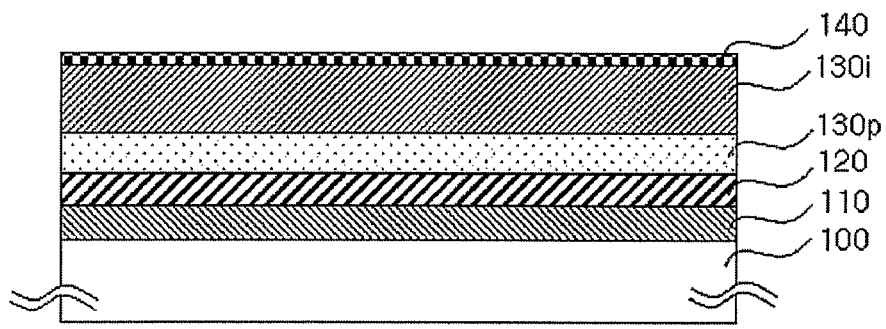

In order to perform metal induced crystallization, as shown in FIG. 5, first, the metal layer 140 is formed on the i-type amorphous silicon layer 130i prior to the formation of the n-type amorphous silicon layer 130n. The metal layer 140 may contain Ni, Al, Ti, Ag, Au, Co, Sb, Pd, Cu, or a combination thereof. Examples of the method for forming the metal layer 140 may include chemical vapor deposition such as LPCVD, PECVD, atomic layer deposition (ALD), and so on, or physical vapor deposition such as sputtering, and so on.

Figure 6:
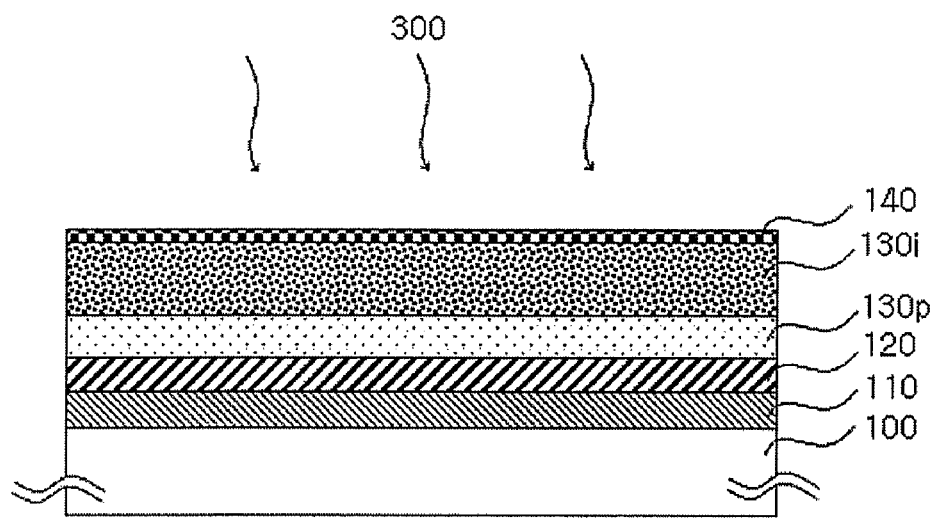

Next, referring to FIG. 6, a crystallization-annealing 300 is performed on the i-type amorphous silicon layer 130i. Through the crystallization-annealing 300, the i-type amorphous silicon layer 130i is crystallized to a i-type polycrystalline silicon layer 130i, and the presence of a metal catalyst makes it possible to perform the crystallization at lower temperature than a solid phase crystallization temperature of an amorphous silicon. The crystallization-annealing 300 is carried out in a typical annealing furnace, preferably under conditions of 400-700° C. for a period of 1 to 10 hours. Moreover, the p-type amorphous silicon layer 130p can also be crystallized through the crystallization-annealing 300 to form a p-type polycrystalline silicon layer 130p.

Figure 7:
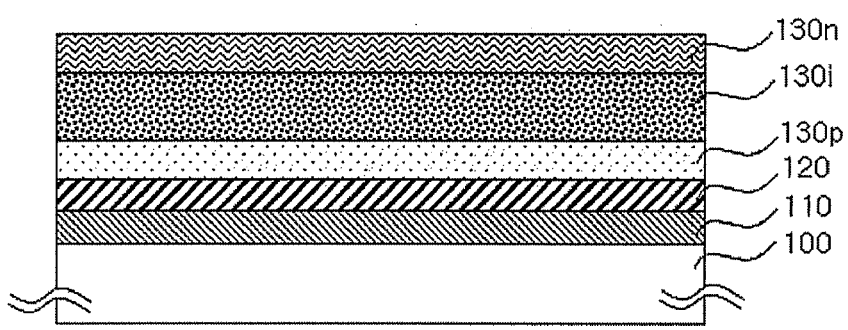
Figure 8:
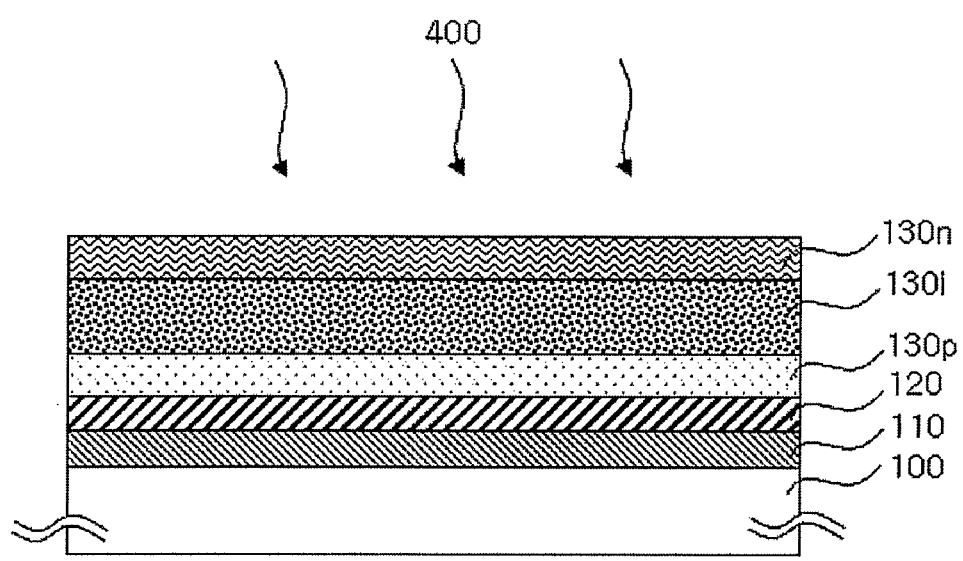

In succession, referring to FIG. 7, the n-type amorphous silicon layer 130n is formed on the i-type polycrystalline silicon layer 130i. The formation and doping methods for the n-type amorphous silicon layer 130n are identical to the formation and doping methods for the p-type amorphous silicon layer 130p and the i-type amorphous silicon layer 130i as noted above, except that phosphor (P) or arsenic (As) is used as an n-type doping impurity. The thickness and the doping concentration for the n-type amorphous silicon layer 130n are determined in conformity with the thickness and the doping concentration typically selected for silicon solar cells.

Figure 18:
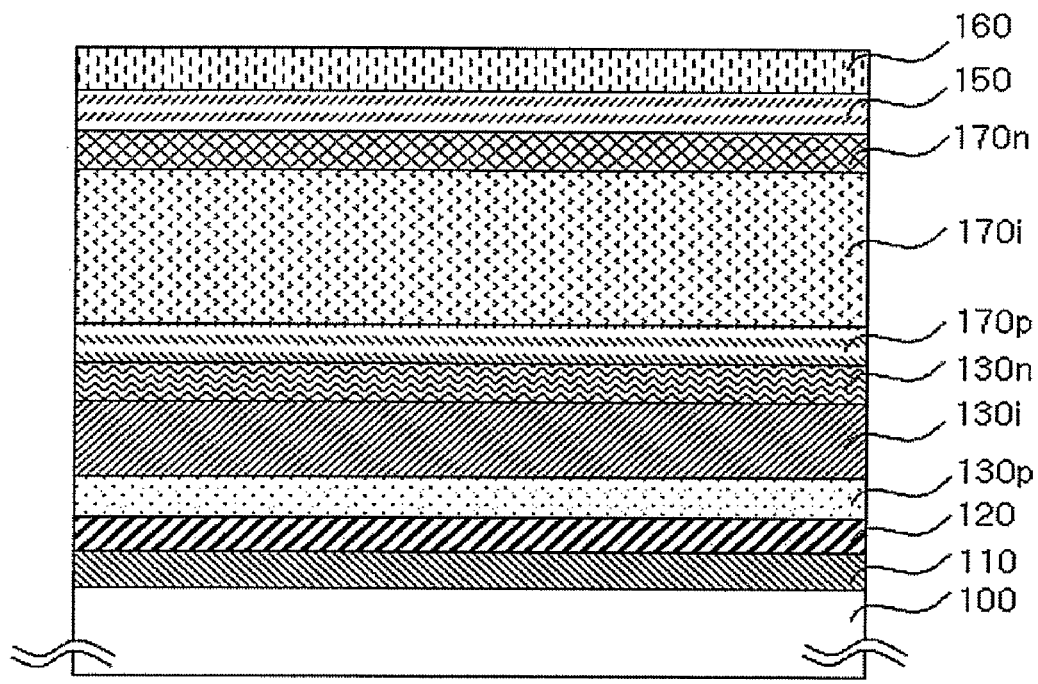

Next, referring to FIG. 18, a gettering 400 is performed to get rid of a metal element, that is, the metal catalyst having been introduced for the MIC in FIG. 6, which remains in the i-type polycrystalline silicon layer 130i. Through the gettering 400, the residual metal such as Ni remaining in the i-type polycrystalline silicon layer 130i diffuses into the n-type amorphous silicon layer 130n to react with the n-type impurities P so as to form a nickel-phosphorous ($Ni_2P$) compound. In this manner, the residual metal in the i-type polycrystalline silicon layer 130i can be removed. Preferably, the gettering 400 is carried out under conditions of 400-600° C. for a period of 1 to 5 hours.

Therefore, even if the introduction of Ni into a solar cell, more specifically, into the i-type polycrystalline silicon layer 130i, may have been inevitable for the MIC, it becomes possible to prevent degradation of overall properties of solar cells caused by metal contamination, e.g., an increase in the leak current.

In the meantime, the amount of the metal catalyst being introduced needs to be controlled to minimize metal contamination in the solar cell. One way of doing so is to control the thickness of the metal layer 140, but the present invention is not always limited thereto. In some cases, the metal layer needs to be made even thinner than one atomic layer in order to keep the amount of residual metal within the polycrystalline silicon layer to a minimum. Here, making the metal layer thinner than one atomic layer means that, the entire area of the amorphous silicon layer is not covered completely with the deposited metal layer, that is, the metal layer is deposited on the amorphous silicon layer sparsely (the coverage rate <1) instead of being deposited continuously. In other words, with the coverage rate less than 1, more metal atoms can be placed between metal atoms that are already deposited on the amorphous silicon layer.

Furthermore, although the embodiment proposed that the crystallization-annealing 300 should be performed after the metal layer 140 is first formed on the i-type amorphous silicon layer 130$i$, the present invention is not always limited thereto. That is, the crystallization-annealing 300 may be performed after the metal layer 140 is formed on the n-type amorphous silicon layer 130$n$ or the p-type amorphous silicon layer 130$p$.

Finally, referring to FIG. 9, the second transparent conductive layer 150 and the metal electrode layer 160 are formed sequentially over the n-type amorphous silicon layer 130$n$ to obtain the complete polycrystalline silicon solar layer 10. The material and the formation method of the second transparent conductive layer 150 are identical to those of the first transparent conductive layer 120. Also, the metal electrode layer 160 is made out of any conductive material such as aluminum, and may be formed by a physical vapor deposition such as thermal evaporation, sputtering, and so on.

In the configuration of the solar cell 10 shown in FIG. 9, the antireflective layer 110, and the first and the second transparent conductive layers 120 and 150 may be excluded as the case may be. Also, it may be more preferably using only either the antireflective layer 110 or the first transparent conductive layer 120 in view of overall properties of the solar cell.

As explained earlier, the manufacturing method of the polycrystalline silicon solar cell in accordance with the first embodiment of the present invention employs the MIC technique to crystallize amorphous silicon to polycrystalline silicon, so that the low-temperature process can be performed on the conventional glass substrate. As a result, manufacturing costs of solar cells can be reduced, and the leak current caused by metal contamination through the gettering can be minimized.

Embodiment II

Hereinafter, a second embodiment of the present invention will be explained in detail with reference to the accompanying drawings.

A solar cell 20 in accordance with the second embodiment of the present invention has the same configuration as the solar cell 10 of the first embodiment explained with reference to FIGS. 1 to 9, except for first p-i-n silicon layers 130$p$, 130$i$ and 130$n$, and second p-i-n silicon layers 170$p$, 170$i$ and 170$n$. Therefore, in the following description of the second embodiment, a substrate 100, an antireflective layer 110, a first transparent conductive layer 120, a metal layer 140, a second transparent conductive layer 150 and a metal electrode layer 160 will not be detailed to avoid the repetition of description on the same elements.

FIGS. 10 to 18 are cross-sectional views illustrating a manufacturing method of a solar cell 20 in accordance with the second embodiment of the present invention.

FIG. 18 illustrates a complete polycrystalline silicon (thin film) solar cell 20 in accordance with the second embodiment of the present invention.

Referring to FIG. 18, the polycrystalline silicon solar cell 20 having a tandem structure includes the antireflective layer 110, the first transparent conductive layer 120, the first p-i-n silicon layers (the p-type silicon layer 130$p$, the i-type silicon layer 130$i$ and the n-type silicon layer 130$n$), the second p-i-n silicon layers (the p-type silicon layer 170$p$, the i-type silicon layer 170$i$ and the n-type silicon layer 170$n$), the second transparent conductive layer 150, and the metal electrode layer 160, which are stacked sequentially over the substrate 100. Here, the first p-i-n silicon layers are amorphous silicon layers, and at least the i-type silicon layer 170$i$ out of the second p-i-n silicon layers is a polycrystalline silicon layer.

More specifically, the polycrystalline silicon solar cell 20 is configured to have a laminate of silicon layers in two p-i-n structures. Here, the p-i-n structure indicates a structure of the p-type doped silicon layers 130$p$ and 170$p$, the n-type doped silicon layers 130$n$ and 170$n$, and the i-type (that is, intrinsic) silicon layers 130$i$ and 170$i$ sandwiched between them, with the i-type silicon layer being relatively insulating compared to the p-type silicon layers 130$p$ and 170$p$ and the n-type silicon layers 130$n$ and 170$n$.

While the embodiment illustrated that completely undoped i-type silicon layers 130$i$ and 170$i$ are placed between the p-type silicon layers 130$p$ and 170$p$ and the n-type silicon layers 130$n$ and 170$n$, the present invention is not necessarily limited thereto, and amorphous silicon layers being relatively insulating (i.e., having low conductivity) compared to the p-type silicon layers 130$p$ and 170$p$ and the n-type silicon layers 130$n$ and 170$n$ may also be placed. For example, it may also be possible to produce highly doped p-type silicon layers 130$p$ and 170$p$ and highly doped n-type silicon layers 130$n$ and 170$n$, and interpose silicon layers 130$i$ and 170$i$ doped with n-type or p-type impurities at a low density between them.

The following is a detailed description about each step of a manufacturing method of the solar cell 20 in accordance with the second embodiment of the present invention.

Figure 10:
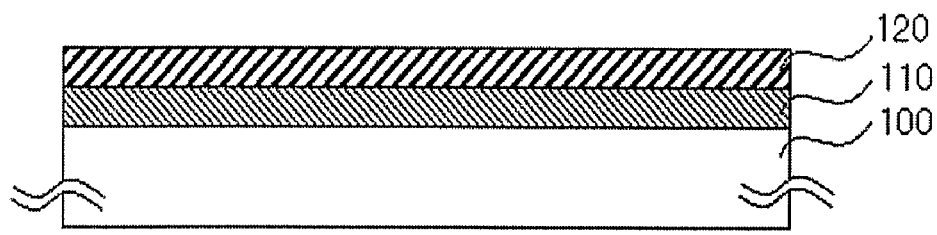
FIGS. 10 to 18 are cross-sectional views illustrating a manufacturing method of a solar cell in accordance with a second embodiment of the present invention.

First, with reference to FIG. 10, the antireflective layer 110 is formed on the substrate 100, and the first transparent conductive layer 120 is formed on the antireflective layer 110, as in the first embodiment.

Figure 11:
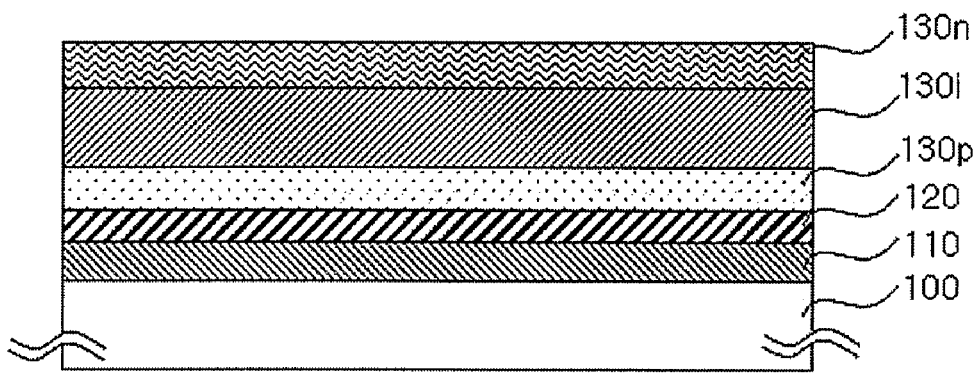

Next, referring to FIG. 11, the three-layer structure of amorphous silicon layers, i.e., the p-type amorphous silicon layer 130$p$, the i-type amorphous silicon layer 130$i$ and the n-type amorphous silicon layer 130$n$, are formed sequentially over the first transparent conductive layer 120 to get the first p-i-n silicon layers for a tandem silicon solar cell 20.

The first p-i-n silicon layers 130$p$, 130$i$ and 130$n$ are formed in amorphous silicon state, and examples of the formation method thereof may include, but are not limited to, chemical vapor deposition such as LPCVD, PECVD, HWCVD, and so on. Preferably, n-type or p-type doping on each of the first p-i-n silicon layers 130$p$, 130$i$ and 130$n$ is done in situ during the formation of the amorphous silicon layer. Generally, boron (B) is used as an impurity for the p-type doping, and phosphor (P) or arsenic (As) is used as an impurity for the n-type doping. The thickness and the doping concentration for each of the first p-i-n silicon layers 130$p$, 130*i* and 130*n* are determined in conformity with the thickness and the doping concentration typically adopted for tandem silicon solar cells.

Figure 12:
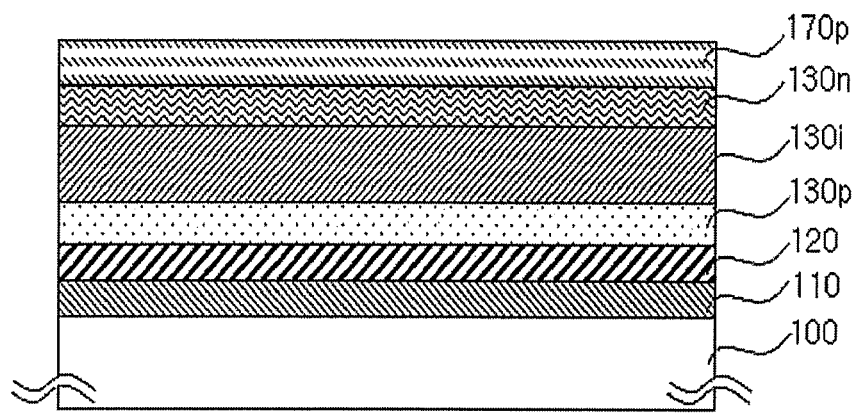
Figure 13:
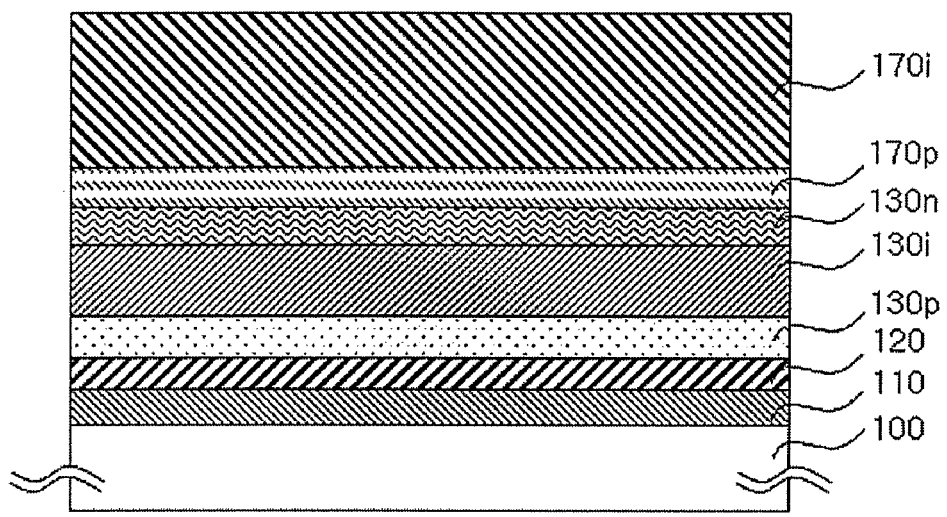

Next, referring to FIGS. 12 and 13, the p-type amorphous silicon layer 170*p* and the i-type amorphous silicon layer 170*i* are formed sequentially on the n-type amorphous silicon layer 130*n*. The formation and doping methods for the p-type amorphous silicon layer 170*p* and the i-type amorphous silicon layer 170*i* are identical to the formation and doping methods for the p-type amorphous silicon layer 130*p* and the i-type amorphous silicon layer 130*i* in the first embodiment described above.

Meanwhile, to manufacture silicon solar cells having a tandem structure of amorphous silicon layer/polycrystalline silicon layer, the present invention employs the MIC technique to crystallize the i-type amorphous silicon layer 170*i* to a polycrystalline silicon layer.

Figure 14:
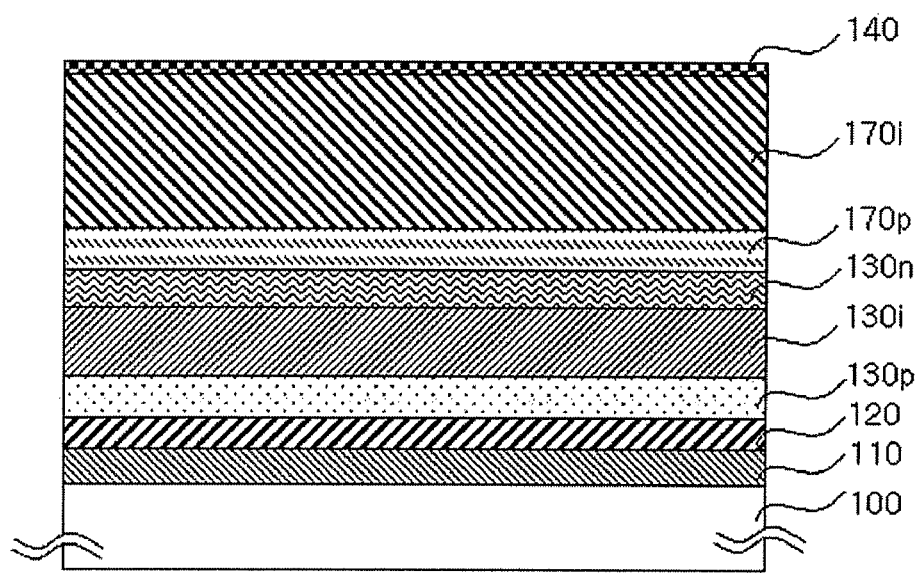

For this, as shown in FIG. 14, first, the metal layer 140 is formed on the i-type amorphous silicon layer 170*i* prior to the formation of the n-type amorphous silicon layer 170*n*.

Subsequently, referring to FIG. 15, a crystallization-annealing 300 is performed on the i-type amorphous silicon layer 170*i*. Through the crystallization-annealing process, the i-type amorphous silicon layer 170*i* is crystallized to the i-type polycrystalline silicon layer 170*i*, and the presence of a metal catalyst makes it possible to perform the crystallization at lower temperature than a solid phase crystallization temperature of an amorphous silicon. The crystallization-annealing process is carried out in a typical annealing furnace, preferably under conditions of 400-700° C. for a period of 1 to 10 hours. Moreover, the p-type amorphous silicon layer 170*p* can also be crystallized through the crystallization-annealing 300 to form the p-type polycrystalline silicon layer 170*p*.

Here, to manufacture silicon solar cells having a tandem structure of amorphous silicon layer/polycrystalline silicon layer in accordance with the present invention, preferably, a crystallization-annealing temperature is selected from a temperature range where solid phase crystallization of the first p-i-n silicon layers, more specifically, the i-type amorphous silicon layer 130*i* does not occur. In other words, it is preferable that, during the crystallization-annealing 300, the i-type amorphous silicon layer 130*i* does not go through the solid phase crystallization reaction to be crystallized to a polycrystalline silicon layer.

Figure 16:
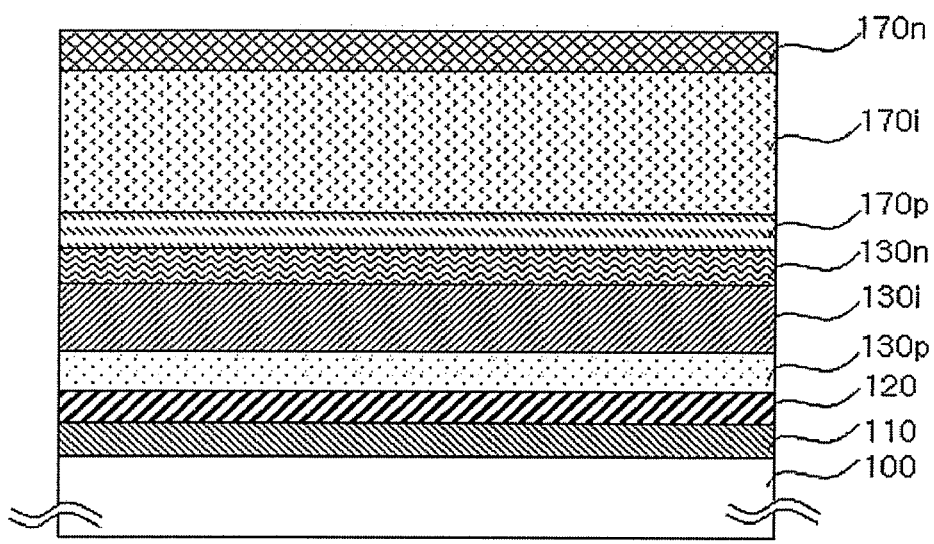

Next, referring to FIG. 16, the n-type amorphous silicon layer 170*n* is formed on the i-type polycrystalline silicon layer 170*i*. The formation and doping methods for the n-type amorphous silicon layer 170*n* are identical to those for the n-type amorphous silicon layer 130*n* in the first embodiment described above. The thickness and the doping concentration for the n-type amorphous silicon layer 170*n* are determined in conformity with the thickness and the doping concentration typically adopted for tandem silicon solar cells.

In this manner, the second p-i-n silicon layers 170*p*, 170*i* and 170*n* for the tandem silicon solar cell 20 are completed. As shown, the second p-i-n silicon layers have exactly the same structure as the first p-i-n silicon layers. Thus, if the first silicon layers have an n-i-p structure, the second silicon layers should also have the n-i-p structure.

Figure 15:
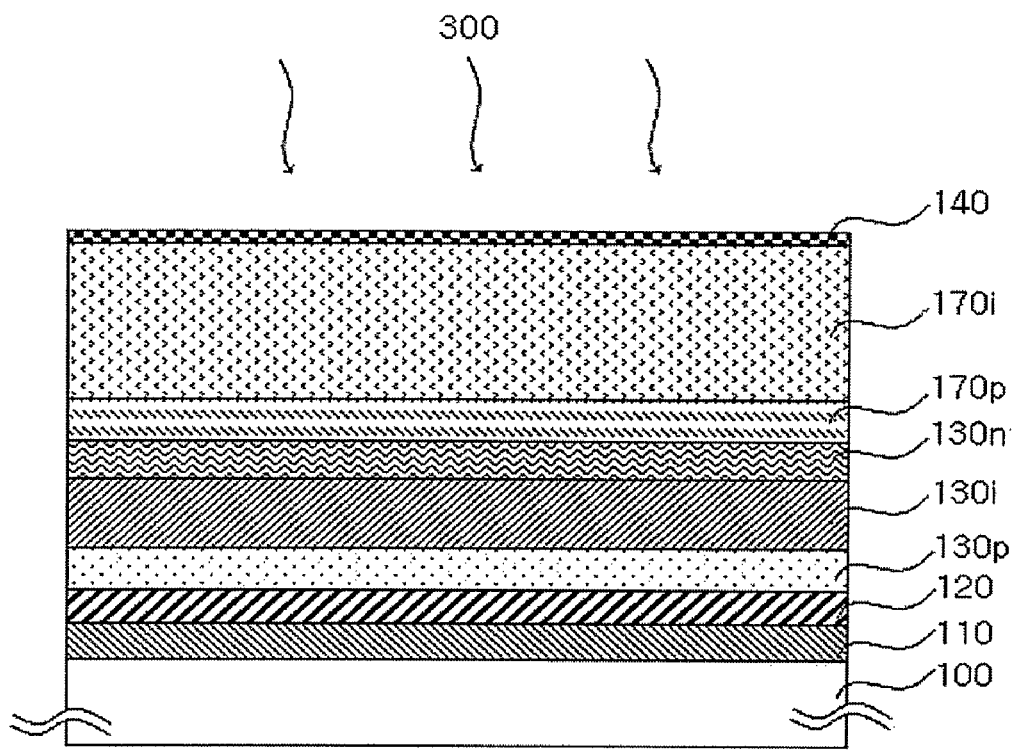
Figure 17:
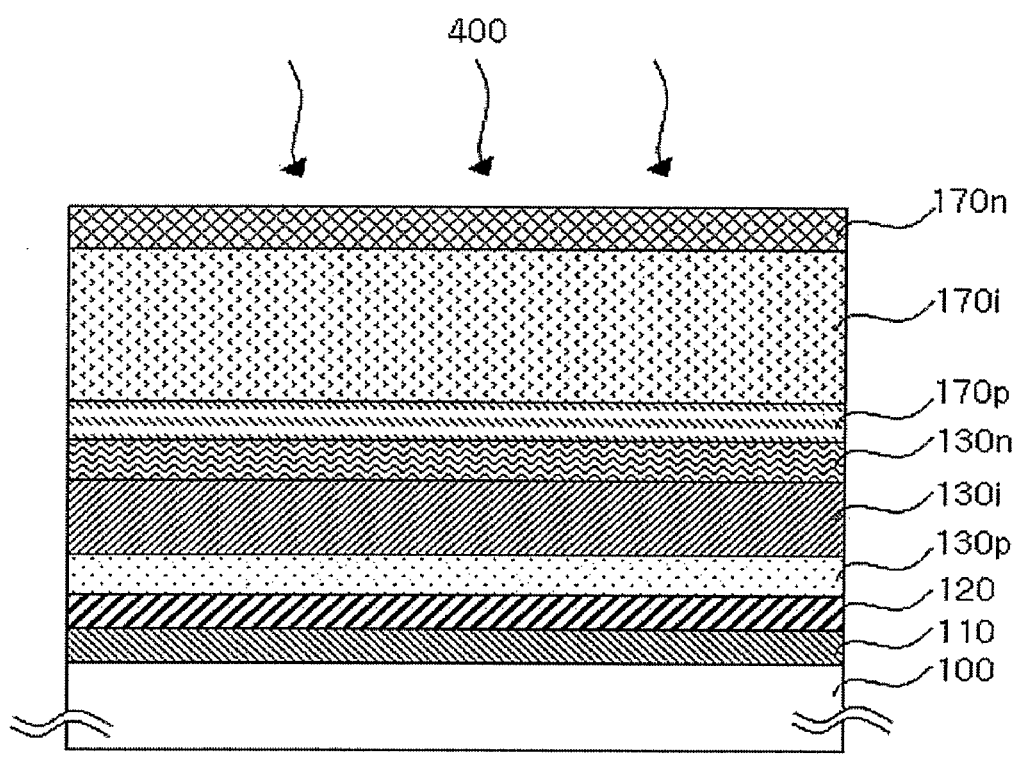

In succession, referring to FIG. 17, a gettering 400 is performed to get rid of a metal element, that is, the metal catalyst having been introduced for the MIC in FIG. 15, which remains in the i-type polycrystalline silicon layer 170*i*. Through the gettering 400, the metal such as Ni remaining in the i-type polycrystalline silicon layer 170*i* diffuses into the n-type amorphous silicon layer 170*n* to react with the n-type impurities P so as to form a nickel-phosphorous ($Ni_2P$) compound. In this way, the residual metal in the i-type polycrystalline silicon layer 170*i* can be removed. Preferably, the gettering 400 is carried out under conditions of 400-600° C. for a period of 1 to 5 hours.

Therefore, even if the introduction of Ni into a solar cell, more specifically, into the i-type polycrystalline silicon layer 170*i*, may have been inevitable for the MIC, it becomes possible to prevent degradation of overall properties of solar cells caused by metal contamination, e.g., an increase in the leak current.

Furthermore, although the embodiment proposed that the crystallization-annealing 300 is performed after the metal layer 140 is first formed on the i-type amorphous silicon layer 170*i*, the present invention is not always limited thereto. That is, the crystallization-annealing 300 may be performed after the metal layer 140 is formed on the n-type amorphous silicon layer 170*n* or the p-type amorphous silicon layer 170*p*.

Finally, referring to FIG. 18, the second transparent conductive layer 150 and the metal electrode layer 160 are formed sequentially over the n-type amorphous silicon layer 170*n*, as in the method in the first embodiment, so as to obtain the complete tandem silicon solar layer 20.

Meanwhile, while the second embodiment of the present invention has explained tandem silicon solar cells having two laminate structures of p-i-n silicon layers, the present invention is not always limited thereto, but, for example, solar cells having three laminate structures of p-i-n silicon layers may also be an embodiment of the present invention. That is to say, if at least one of the silicon layers constructing any solar cell contains a metal-phosphorous compound therein, such a solar cell and its manufacturing method should be deemed to belong to the scope of the present invention.

Moreover, compared with the conventional tandem silicon solar cells for which the PECVD is employed to prepare micro-crystalline silicon itself, the present invention tandem silicon solar cells for which the MIC technique is employed to crystallize amorphous silicon to polycrystalline silicon can be manufactured with considerably reduced time and much reduced costs.

Although the first and second embodiments of the present invention have adopted the p-i-n structure as the basic structure for constructing a solar cell, the present invention is not always limited thereto, but may adopt the n-i-p structure, i.e., a laminate structure of n-type silicon layer/i-type silicon layer/p-type silicon layer. However, in case of adopting the n-i-p structure, considering that solar light enters from the p side (that is, solar light enters from the opposite side of the substrate), the substrate is not absolutely required to be made out of transparent materials like glass, but it may be made out of others like silicon, metal and metal alloy.

In this case, in terms of the enhancement of efficiency of the silicon solar cells, it is generally preferable to let solar light enter the i-type silicon layer through the p-type silicon layer. This is because of a drift mobility change that exists in electron-hole pairs produced by solar light. Generally, holes have relatively lower drift mobility than electrons. Therefore, in order to maximize carrier collection efficiency throughout the solar light, most carriers must be produced on the interface between the p-type silicon layer and the i-type silicon layer, so as to keep the movement distance of a hole to minimum.

While the present invention has been described with respect to certain preferred embodiments, it will be apparent to those skilled in the art that various changes and modifications may be made without departing from the scope of the invention as defined in the following claims.

What is claimed is:

1. A method for manufacturing a solar cell, comprising the steps of:
   (a) forming a first amorphous silicon layer on a substrate;
   (b) forming a second amorphous silicon layer on the first amorphous silicon layer;
   (c) forming a metal layer on the second amorphous silicon layer;
   (d) performing crystallization-annealing the second amorphous silicon layer; and
   (e) forming a third amorphous silicon layer on a resulting crystalline silicon layer of the step (d).

2. The method according to claim 1, further comprising the step of:
   performing gettering a residual metal in the resulting crystalline silicon layer of the step (d).

3. The method according to claim 2, wherein a gettering temperature is in a range of 400° C. to 600° C.

4. The method according to claim 2, wherein the metal reacts with impurities in the third amorphous silicon layer to produce a compound.

5. The method according to claim 1, wherein the first to third amorphous silicon layers are formed by chemical vapor deposition.

6. The method according to claim 1, wherein the metal layer contains Ni, Al, Ti, Ag, Au, Co, Sb, Pd, Cu or a combination thereof.

7. The method according to claim 1, wherein the metal layer is formed by physical vapor deposition or chemical vapor deposition.

8. The method according to claim 1, wherein a crystallization-annealing temperature is in a range of 400° C. to 700° C.

9. A method for manufacturing a solar cell, comprising the steps of:
   (a) forming a first amorphous silicon layer on a substrate;
   (b) forming a second amorphous silicon layer on the first amorphous silicon layer;
   (c) forming a third amorphous silicon layer on the second amorphous silicon layer;
   (d) forming a fourth amorphous silicon layer on the third amorphous silicon layer;
   (e) forming a fifth amorphous silicon layer on the fourth amorphous silicon layer;
   (f) forming a metal layer on the fifth amorphous silicon layer;
   (g) performing crystallization-annealing the fifth amorphous silicon layer; and
   (h) forming a sixth amorphous silicon layer on a resulting crystalline silicon layer of the step (g).

10. The method according to claim 9, further comprising the step of:
    performing gettering a residual metal in the resulting crystalline silicon layer of the step (g).

11. The method according to claim 10, wherein the metal reacts with impurities in the sixth amorphous silicon layer to produce a compound.

12. The method according to claim 10, wherein a gettering temperature is in a range of 400° C. to 600° C.

13. The method according to claim 9, wherein the first to sixth amorphous silicon layers are formed by chemical vapor deposition.

14. The method according to claim 9, wherein a crystallization-annealing temperature is lower than a solid phase crystallization temperature of the first to sixth amorphous silicon layer.

15. The method according to claim 14, wherein a crystallization-annealing temperature is in a range of 400° C. to 700° C.

16. The method according to claim 9, wherein the metal layer contains Ni, Al, Ti, Ag, Au, Co, Sb, Pd, Cu or a combination thereof.

17. The method according to claim 9, wherein the metal layer is formed by physical vapor deposition or chemical vapor deposition.

* * * * *